United States Patent
Li et al.

(10) Patent No.: US 10,366,177 B2
(45) Date of Patent: Jul. 30, 2019

(54) CUTTING DRUM AND METHOD OF DESIGNING A CUTTING DRUM

(71) Applicant: Commonwealth Scientific and Industrial Research Organisation, Campbell, Australian Capital Territory (AU)

(72) Inventors: Xing Sheng Li, Runcorn (AU); Yong Sun, Durack (AU); Hua Guo, Anstead (AU)

(73) Assignee: COMMONWEALTH SCIENTIFIC AND INDUSTRIAL RESEARCH ORGANISATION, Campbell, Australian Capital Territory (AU)

( * ) Notice: Subject to any disclaimer, the term of this patent is extended or adjusted under 35 U.S.C. 154(b) by 1311 days.

(21) Appl. No.: 14/381,731

(22) PCT Filed: Sep. 26, 2012

(86) PCT No.: PCT/AU2012/001166
§ 371 (c)(1),
(2) Date: Aug. 28, 2014

(87) PCT Pub. No.: WO2013/126944
PCT Pub. Date: Sep. 6, 2013

(65) Prior Publication Data
US 2015/0032433 A1    Jan. 29, 2015

(30) Foreign Application Priority Data
Mar. 1, 2012    (AU) ................ 2012900801

(51) Int. Cl.
*E21C 25/00*    (2006.01)
*G06F 17/50*    (2006.01)
(Continued)

(52) U.S. Cl.
CPC ............... *G06F 17/50* (2013.01); *E21C 25/00* (2013.01); *E21C 25/10* (2013.01); *E21C 35/18* (2013.01)

(58) Field of Classification Search
CPC .......... G06F 17/50; E21C 25/00; E21C 25/10; E21C 35/18
See application file for complete search history.

(56) References Cited

U.S. PATENT DOCUMENTS 4,190,296 A    2/1980    O'Dell
7,475,947 B2    1/2009    LeBegue
(Continued)

FOREIGN PATENT DOCUMENTS

CN    201486554 U    5/2010
GB       1232915 A    5/1971
(Continued)

OTHER PUBLICATIONS

B Tiryaki, M Ayhan, Oz Hekimoglu; A New computer program for cutting head design of roadheaders and drum shearers; 8 pages (Year: 2001).*

(Continued)

*Primary Examiner* — S. Sough
*Assistant Examiner* — Kimberly L Jordan
(74) *Attorney, Agent, or Firm* — Tarolli, Sundheim, Covell & Tummino LLP

(57) ABSTRACT

A method of designing a cutting drum for earth moving equipment is disclosed. The cutting drum has two or more ring segments, each ring segment comprising a plurality of cutting tools, and the rotational position of at least one ring segment is adjustable relative to one or more other ring segment and fixable in the new rotational position. The method involves inputting a plurality of design parameters of a cutting drum into a computer program, performing a (Continued)

computer simulated analysis of the cutting drum using the computer program to determine at least one operational value associated with at least one design objective, using the computer simulated analysis to determine the relative locations of the ring segments that correspond to the at least one design objective, and rotating the or each adjustable ring segment relative to at least one other ring segment so that the relative locations of the ring segments correspond to the at least one design objective. A cutting drum for use with the method is also disclosed.

18 Claims, 9 Drawing Sheets

(51) Int. Cl.
  *E21C 25/10* (2006.01)
  *E21C 35/18* (2006.01)

(56) References Cited

U.S. PATENT DOCUMENTS

| | | |
|---|---|---|
| 2006/0255649 A1 | 11/2006 | Dawood |
| 2008/0116734 A1* | 5/2008 | Bechem .................. E21C 27/22 299/10 |
| 2008/0217986 A1* | 9/2008 | LeBegue .................. E21C 25/10 299/58 |
| 2011/0037308 A1 | 2/2011 | O'Neill |

FOREIGN PATENT DOCUMENTS

| | | |
|---|---|---|
| RU | 972080 | 11/1982 |
| WO | 2004/081345 A1 | 9/2004 |

OTHER PUBLICATIONS

Supplementary European Search Report to corresponding European patent application No. 12870116.6, dated Oct. 19, 2015, 4 pages.

Ying et al., "The System of a CAD for Shearer Drum" China Academic Journal Electronic Publishing House, http://www.cnki.net.

Chinese Office Action to corresponding Chinese patent application No. 2012800728304, dated Nov. 11, 2015.

European Examination Report for corresponding European Application No. 12870116.6, dated Mar. 20, 2018, pp. 1-6.

* cited by examiner

CUTTING DRUM AND METHOD OF DESIGNING A CUTTING DRUM

FIELD OF THE INVENTION

The present invention relates to a cutting drum and to a method of designing a cutting drum.

BACKGROUND OF THE INVENTION

It is known to use continuous drum type earth moving equipment, such as continuous drum type miners, in soft rock mining, particularly coal and iron ore mining and increasingly in salt and potash mining. Such drum type earth moving equipment typically include a rotatable drum on which are disposed several cutting tools, for example cutting picks, that cut soft rock away from a target rock body during use as the drum rotates. The cutting tools are distributed on the drum in a pattern referred to as a lacing design.

Increasing demands to improve cutting performance, improve safety and energy efficiency and reduce operating costs have lead to a desire to improve the design of cutting drums, and in particular to improve the lacing design of the cutting tools on a cutting drum. In addition to the lacing design, the performance of the cutting drum also depends on the relationship between the cutter drum type, cutting geometry of the drum, rock being mined and operating parameters of the earth moving equipment.

With current drum type miners, in order to modify the cutting drum design it is necessary to return the cutting drum to the manufacturer in order to make the modifications because it is not feasible to modify the cutting drum on-site. This is unduly time consuming and inefficient.

SUMMARY OF THE PRESENT INVENTION

In accordance with a first aspect of the invention, there is provided a method of designing a cutting drum for earth moving equipment, the cutting drum comprising two or more ring segments, each ring segment comprising a plurality of cutting tools, and the rotational position of at least one ring segment being adjustable relative to one or more other ring segment and fixable in the new rotational position, the method comprising the steps of:
(A) inputting a plurality of design parameters of a cutting drum into a computer program;
(B) performing a computer simulated analysis of the cutting drum using the computer program to determine at least one operational value associated with at least one design objective;
(C) using the computer simulated analysis to determine the relative locations of the ring segments that correspond to the at least one design objective; and
(D) rotating the or each adjustable ring segment relative to at least one other ring segment so that the relative locations of the ring segments correspond to the at least one design objective.

In an embodiment, the method further comprises repeating steps (A) to (D) after the cutting drum has been used.

In an embodiment, step (B) comprises virtually progressively rotating the or each adjustable ring segment relative to at least one other ring segment and calculating values associated with the design objective(s) after each virtual rotation.

In an embodiment, step (C) comprises using the calculated values to determine the relative locations of the ring segments that correspond to the at least one design objective.

The design objective may be selected from a group comprising:
i. reducing energy usage;
ii. reducing manufacturing cost;
iii. increasing throughput;
iv. reducing dust formation; and
v. reducing cutting tool wear.

In an embodiment, the design objective comprises optimisation of at least one operational value, for example optimisation of a force and/or torque balance of the cutting drum.

In an embodiment, the method comprises using the computer simulated analysis to determine at least one cutting drum design parameter other than the relative locations of the ring segments, and modifying the at least one other cutting drum design parameter using the determined at least one operational value.

In an embodiment, the method comprises the steps of:
graphically displaying of at least a portion of the computer simulated analysis; and
using the graphical display to determine at least one operational value associated with the at least one design objective.

In accordance with a second aspect of the invention, there is provided a cutting drum for earth moving equipment, comprising:
a drum portion comprising a plurality of ring segments;
a plurality of cutting tools disposed on an outwardly facing surface of the drum portion, the cutting tools forming a cutting tool lacing design, each ring segment comprising at least one cutting tool;
wherein the rotational position of at least one ring segment is adjustable relative to at least one other ring segment such that the cutting tool lacing design is adjustable.

In an embodiment, the ring segments comprise at least one fixed ring segment and at least one adjustable ring segment.

In an embodiment, the cutting drum comprises a plurality of adjustable ring segments.

In an embodiment, at least one adjustable ring segment is rotatable 360 degrees around a common axis relative to at least one other ring segment.

In an embodiment, at least one of the ring segments is detachable.

In an embodiment, the cutting drum comprises at least one position mark usable to indicate the relative angular position of at least one adjustable ring segment to a user.

In an embodiment, each adjustable ring segment is disposable in a locked position wherein the adjustable ring segment engages with an adjacent fixed ring segment and the adjustable ring segment is not rotatable relative to the adjacent fixed ring segment, and a released position wherein the adjustable ring segment does not engage with the adjacent fixed ring segment and the adjustable ring segment is rotatable relative to the adjacent fixed ring segment.

In an embodiment, the cutting drum comprises a shaft on which each ring segment is disposed, one of the shaft and a fixed ring segment including a key member, and the other of the shaft and the fixed ring segment including a channel arranged to slidably receive the key member, the key member and the channel cooperating to prevent rotation of the fixed ring segment whilst permitting slidable movement of the fixed ring member relative to the shaft.

Each adjustable ring segment and adjacent fixed ring segment may include complimentary first and second engagement portions arranged to enable the adjustable ring segment to mate with the adjacent fixed ring segment and thereby prevent rotation of the adjustable ring segment relative to the adjacent fixed ring segment.

In an embodiment, the engagement portions include complimentary teeth.

In an embodiment, the cutting tools comprise cutting picks, saws and/or drill bits.

In accordance with a third aspect of the invention, there is provided a mining machine comprising a cutting drum according to the above second aspect of the present invention.

In accordance with a fourth aspect of the present invention, there is provided a method of cutting comprising using the cutting drum according to the second aspect of the present invention.

In accordance with a fifth aspect of the present invention, there is provided a method of redesigning a cutting drum for earth moving equipment, the cutting drum comprising two or more ring segments, each ring segment comprising a plurality of cutting tools, and the rotational position of at least one ring segment being adjustable relative to one or more other ring segment and fixable in the new rotational position, the method comprising the steps of:

(A) inputting a plurality of design parameters of a cutting drum into a computer program;
(B) performing a computer simulated analysis of the cutting drum using the computer program to determine at least one operational value associated with at least one design objective;
(C) using the computer simulated analysis to determine the relative locations of the ring segments that correspond to the at least one design objective;
(D) rotating the or each adjustable ring segment relative to at least one other ring segment so that the relative locations of the ring segments correspond to the at least one design objective; and
repeating steps (A) to (D) after a period of cutting drum use.

In accordance with a sixth aspect of the present invention, there is provided a computing device arranged to carry out the method according to the first or fifth aspect of the present invention.

DESCRIPTION OF THE DRAWINGS

The present invention will now be described, by way of example only, with reference to the accompanying drawings, in which.

DETAILED DESCRIPTION OF PREFERRED EMBODIMENTS

Figure 1:
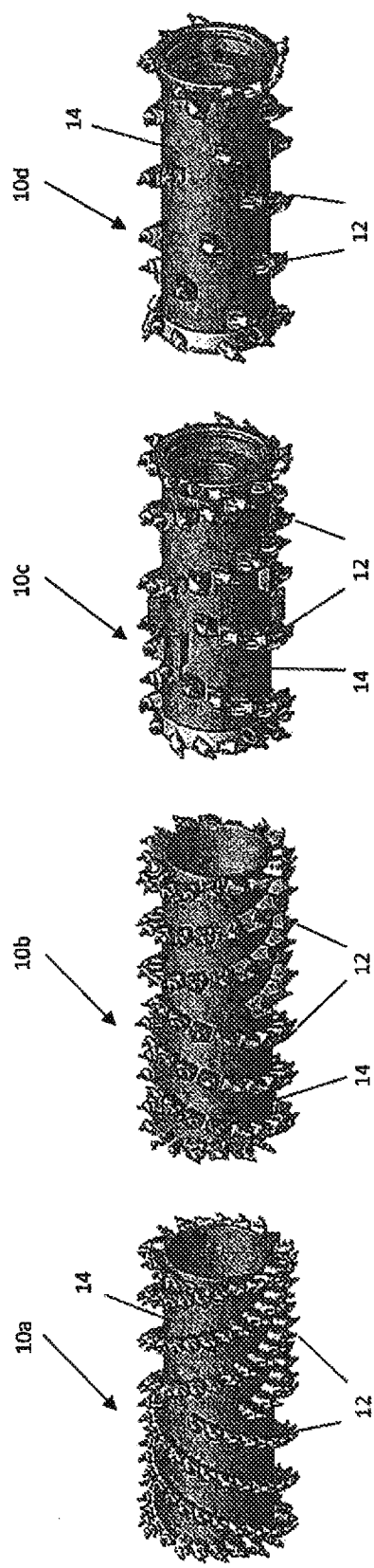
FIG. 1 shows diagrammatic perspective views of several conventional cutting drums for use in a continuous miner, each cutting drum including a different lacing pattern.

Referring to FIG. 1, several conventional cutting drums are shown. Each of the cutting drums 10a, 10b, 10c, 10d has a different lacing design that defines the relative locations of cutting tools 12, in the present examples cutting picks, on a cylindrical drum member 14 of the cutting drum 10a, 10b, 10c, 10d. During use, the cutting drum 10a, 10b, 10c, 10d is caused to rotate in contact with a target rock body.

The lacing designs of the cutting drums 10a, 10b, 10c, 10d are different, and as a consequence each cutting drum 10a, 10b, 10c, 10d is configured for a particular purpose and/or particular rock type.

The lacing patterns of cutting tools on the drums are designed so as to effect relieved cutting, wherein as the cutting drum rotates the cutting action of each cutting tool is facilitated by the cutting action of the tools that it follows, and similarly each cutting tool facilitates the cutting action of each tool that follows it.

However, it will be appreciated that each of the cutting drums 10a, 10b, 10c, 10d shown in FIG. 1 has a defined cutting tool lacing pattern that is fixed, in that in order to modify the lacing design of the cutting drum it is necessary to return the cutting drum 10a, 10b, 10c, 10d to the manufacturer. Modification of the cutting tool lacing pattern on site is not possible.

An alternative conventional cutting drum includes multiple ring segments, each ring segment comprising a plurality of cutting tools. However, while the cutting drum includes multiple ring segments, the rotational position of the ring segments are fixed relative to each other and it is not possible to readily modify the rotational position of one or more of the ring segments relative to the other ring segments.

Figure 2:
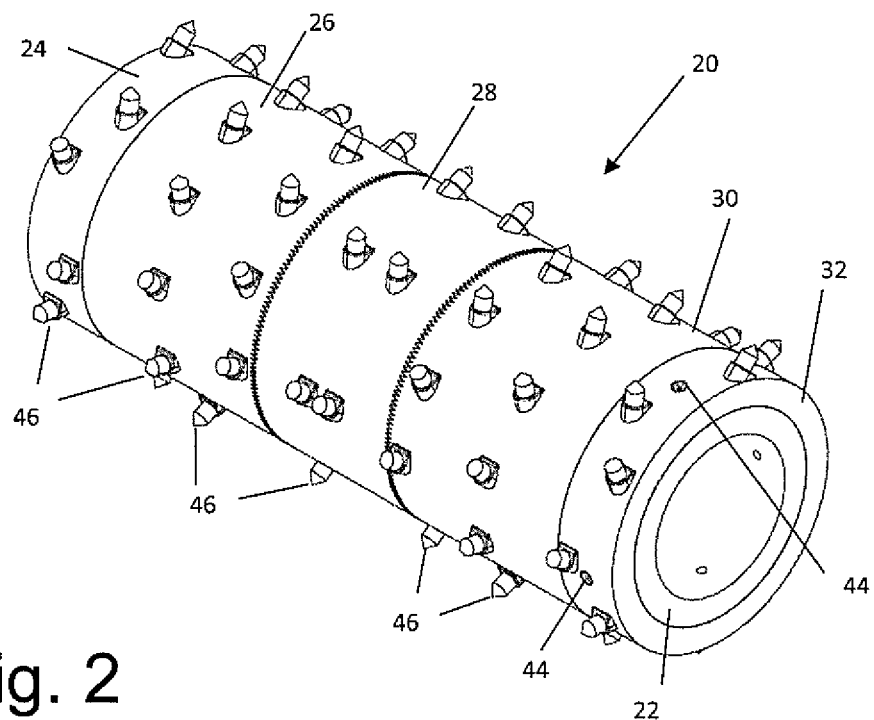
FIG. 2 is a diagrammatic perspective view of a cutting drum in accordance with an embodiment of the present invention.
Figure 4:
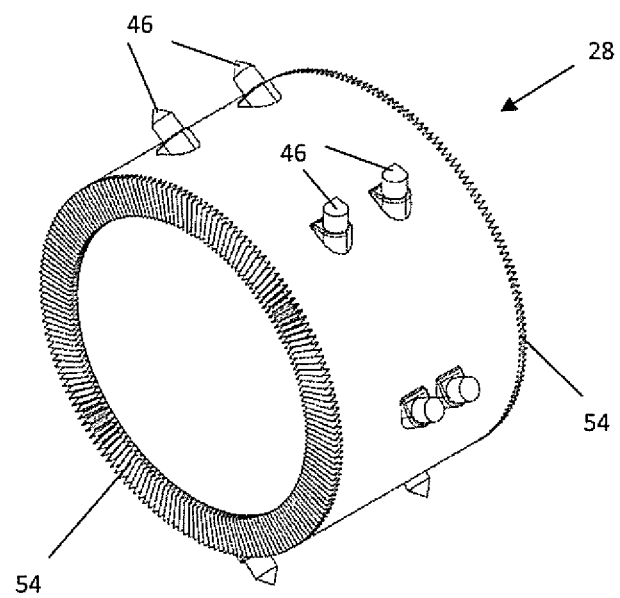
FIG. 4 is a diagrammatic perspective view of a rotatable ring segment of the cutting drum shown in FIGS. 2 and 3.
Figure 3:
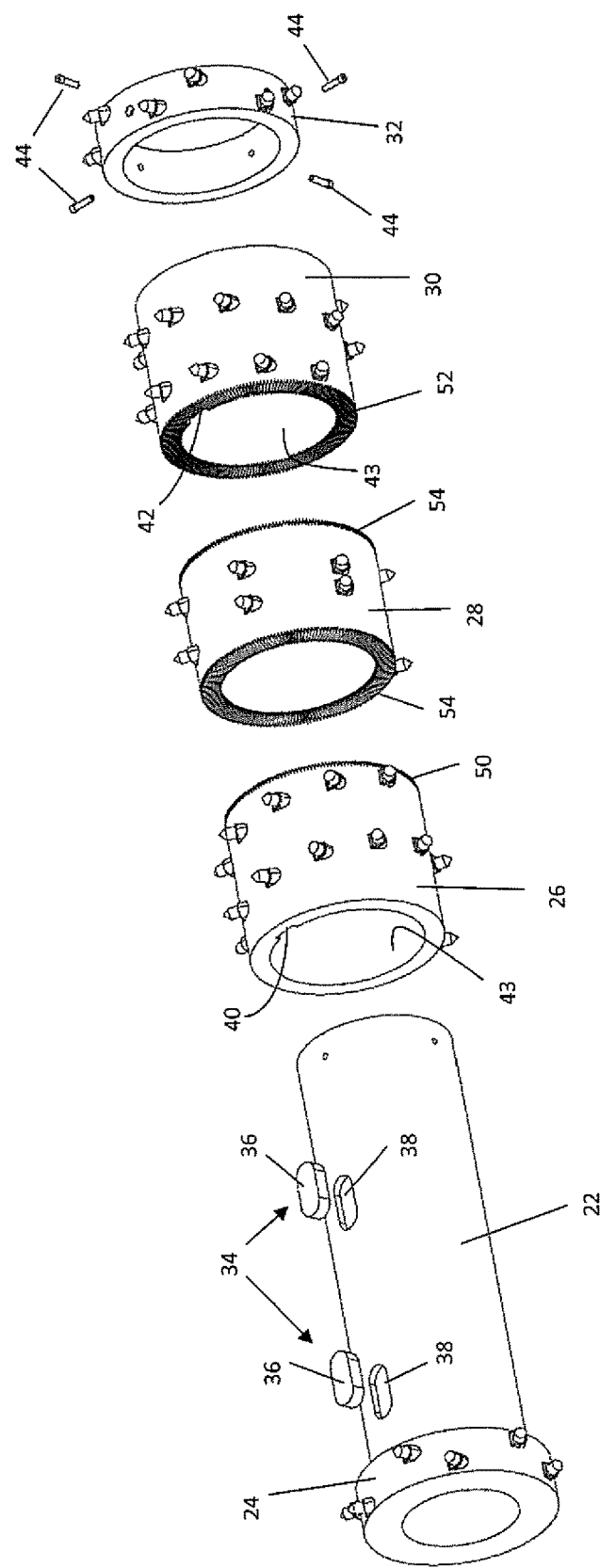
FIG. 3 is a diagrammatic exploded perspective view of the cutting drum shown in FIG. 2.

Referring to FIGS. 2 to 4 of the drawings, a cutting drum 20 according to an embodiment of the invention is shown.

The cutting drum 20 includes a shaft 22 having an attached end ring 24, a first fixed ring segment 26 disposed on the shaft 22 adjacent the end ring 24, a rotatable ring segment 28 disposed on the shaft 22 adjacent the first ring segment 26, and a second fixed ring segment 30 disposed on the shaft 22 adjacent the rotatable ring segment 28. The fixed and rotatable ring segments are held on the shaft 22 by the end ring 24 and a lock ring 32 disposed on the shaft adjacent the second fixed ring segment 30.

As shown more particularly in FIG. 3, the first and second fixed ring segments 26, 30 are mounted on the shaft 22 such that rotation relative to the shaft 22 is prevented. In this example, this is achieved by providing the shaft with a first locking portion 34 for each fixed ring segment 26, 30 and providing each fixed ring segment 26, 30 with a respective complementary second locking portion 40, 42, the first and second locking portions engaging with each other to prevent rotation of the fixed ring segments 26, 30 relative to the shaft 22.

In this example, each of the first locking portions 34 includes a key member 36 that is arranged to engage in a recess 38 formed in the shaft 22, and each of the second locking portions comprises a channel 40, 42 for slidably receiving a key member 36, each channel 40, 42 formed in an internal surface 43 of a respective fixed ring segment 26, 30.

The lock ring 32 may be fixed relative to the shaft 22 in any suitable way, in this example using lock bolts 44.

Outwardly facing surfaces of the end ring 24, the fixed ring segments 26, 30, the rotatable ring segment 28 and the lock ring 32 are provided with cutting tools, in this example cutting picks 46, disposed on the surfaces in a defined lacing pattern. However, while each ring 24, 26, 28, 30, 32 has cutting picks disposed in a defined lacing pattern, the global lacing pattern of the complete cutting drum 20 may be modified by rotating the rotatable ring segment 28 on the shaft 22 relative to the fixed ring segments 26, 30.

While the cutting drum 20 is configured such that the ring segment 28 can be rotated on the shaft 22, the relative position of the rotatable ring segment 28 is fixed during use, in this example by providing each of the fixed ring segments 26, 30 with a respective first engaging portion, and providing the rotatable ring segment 28 with complimentary second engaging portions 54. Each of the first engaging portions 50, 52 is arranged to mate with a second engaging portion 54 so as to restrict relative rotational movement. In this example, each of the first and second engaging portions comprises complimentary teeth.

In order to modify the lacing pattern of the cutting drum 20, a user loosens the lock bolts 44 and slides the lock ring 32 on the shaft 22 in a direction away from the end ring 24. The user then slides the second fixed ring segment 30 and the rotatable ring segment 28 on the shaft 22 in a direction away from the end ring 24 until the engaging portions 50, 52, 54 disengage from each other, and rotates the ring segment 28 to the desired rotational position relative to the fixed ring segments 26, 30. The user then slides the rotatable ring 28, the second fixed ring 30 and the lock ring 32 towards the end ring 24 until the engaging portions 50, 52, 54 mate with each other, and fixes the lock ring 32 relative to the shaft 22 using the lock bolts 44.

It will be understood that while the cutting tools of the present cutting drum 20 are cutting picks, any other type of cutting tools are envisaged, such as saws and drill bits. Examples of suitable picks, saws and drill bits are disclosed in WO 01/88322, page 1, lines 12 to page 2, line 10; page 2, line 11 to 30; and page 2, line 31 to page 3, line 28 respectively, the contents of which are hereby incorporated by reference.

While the present embodiment includes 2 ring segments, 1 of which is rotatable relative to the other ring segments, it will be appreciated that any number of fixed and rotatable ring segments are envisaged, the important aspect being that at least one ring segment is rotatable relative to the other ring segments so that the lacing design of the cutting drum is adjustable.

In the present example, the adjustable ring segment is located centrally of the fixed ring segments, and such a symmetrical configuration serves to minimize the drum axial force. However, it will be understood that the adjustable ring segments could as an alternative be located at any location on the cutting drum.

It will be understood that the cutting tool design pattern on each of the ring segments may or may not be the same, and that each adjustable ring segment may be rotatable at least 90 degrees, more preferably at least 180 degrees and most preferably at least 360 degrees around the longitudinal axis of the cutting drum. The greater the rotatability of a ring segment, the greater the ability to adjust the cutting tool lacing design to meet one or more performance criteria (i.e. design objectives) of the cutting drum.

In order to enable the relative angular positions of the ring segments to be easily determined, the fixed and adjustable ring segments may be provided with position marks that are usable to indicate the relative angular positions of the rings to a user.

The ring segments are preferably configured to form a unitary cutting drum. For the purposes of the present invention, unitary cutting drum means that each ring segment is disposed against an adjacent ring segment to form a substantially continuous cutting drum surface on which the cutting tools are disposed.

The process of designing a cutting drum is complex. In addition, because current cutting drum design methods typically treat the drum as a single body, irrespective of whether the drum comprises an integrally formed single cylindrical drum member or several cylindrical ring segments joined together to form a drum, it is very difficult to optimise the design of the drum over the lifetime of the drum because the cutting tools of the drum wear over time.

To assist in the design process, several semi-theoretical and empirical models have been developed that draw upon a large number of parameters including:
  total number of cutting tools;
  centre pitch of the cutting tools;
  outer pitch of the cutting tools;
  relative angle, set angle, shift angle and balance angle of the cutting tools;
  sump rate, that is, the rate at which the machine including the cutting drum advances into a face of a target rock body (this is a linear motion);
  drum speed, that is, the rotational speed of the drum;
  cutting angle, that is, the angle made by the segment of the drum that is in contact with the face of the target rock body at any instant in time;
  strut width, that is, the clearance space provided between outer and centre drums for strut cutting tools;
  number of starts, that is, the number of vanes on the drum;

number of cutting tools per line, that is, the number of cutting tools on a single-cutting tool line;

line spacing values, that is, the distance between two adjacent cutting tools on the drum;

cutting tool position information including angle of placement, cutting tool type, angle of lean and angle of skew for each cutting tool on the drum; and earth formation characteristics.

The cutting tool lacing pattern that will be used to define the respective locations of cutting tools on a new cutting drum is determined initially using conventional computer modelling programs.

Figure 5:
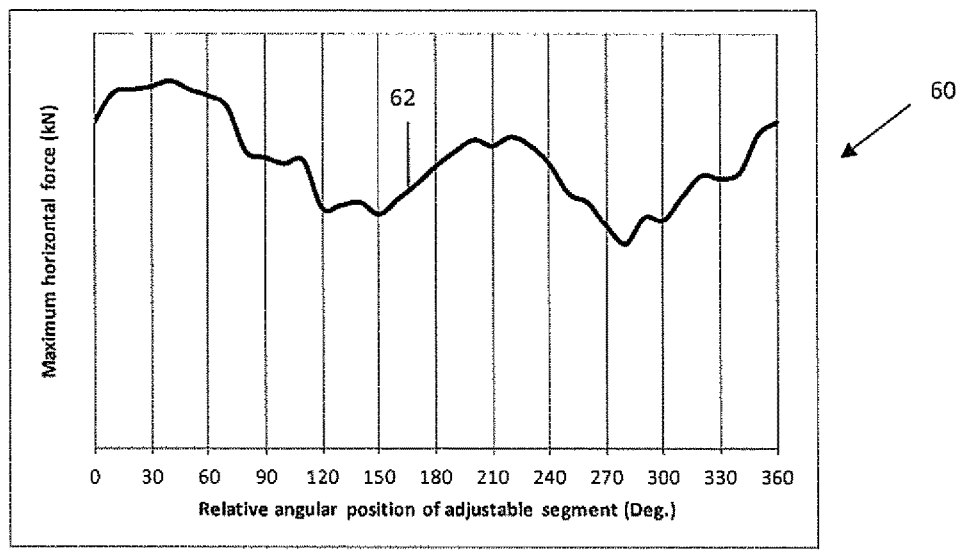
FIG. 5 is a graph illustrating the results of a computer simulation of the relationship between maximum horizontal force acting on a new cutting drum and the angular position of a rotatable ring segment of the cutting drum relative to the positions of other ring segments of the cutting drum that are not rotated.

A graph 60 illustrating the results of a computer simulation of the relationship between maximum horizontal force acting on a cutting drum for a particular lacing pattern of cutting tools, and for varying relative angles between a rotatable ring and fixed rings, is shown in FIG. 5. As can be by plot 62 on the graph 60, the maximum horizontal force varies with rotational position of the rotatable ring relative to the fixed rings.

Figure 6:
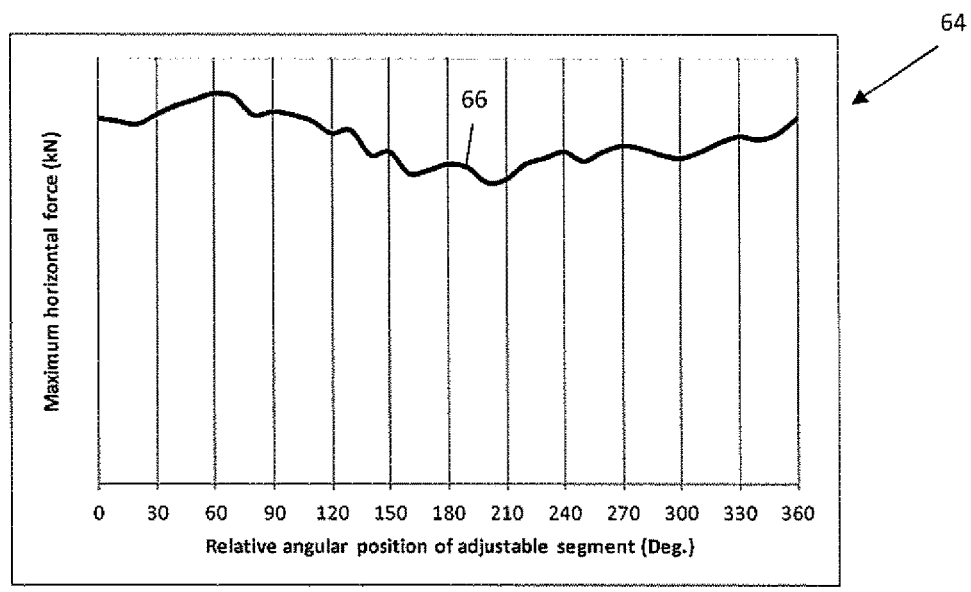
FIG. 6 is a graph illustrating the results of a computer simulation of the relationship between maximum horizontal force acting on a used drum and the angular position of a rotatable ring segment of the cutting drum relative to the positions of other ring segments of the cutting drum that are not rotated, after prolonged operation of the cutting drum.

A graph 64 illustrating the results of a computer simulation of the relationship between maximum horizontal force acting on a used cutting drum for the same lacing pattern as for the graph 60 in FIG. 5, and for varying relative angles between a rotatable ring and fixed rings, is shown in FIG. 6. As can be by plot 66 on the graph 64, the maximum horizontal torque varies with rotational position of the rotatable ring relative to the fixed rings, although it is clear that after the cutting drum has been used for a prolonged period, the variation in maximum force is different to the variation in maximum force of a new cutting drum represented in FIG. 5.

Accordingly, if an objective is to minimise the maximum horizontal force, the graph 60 in FIG. 5 may be used before the cutting drum is used, and the graph 64 in FIG. 6 may be used after the cutting drum has been used, to determine the appropriate rotational position of the adjustable ring to achieve this objective. In this example, to achieve the maximum horizontal force after prolonged use, the configuration of the cutting drum would be modified using the information in FIG. 6 so as to move the rotatable ring segment to a location corresponding to a relative angle of about 200°. It will be appreciated that this adjustment can be carried out on-site.

While the graphs in FIGS. 5 and 6 represent values calculated for a cutting drum having one ring segment that is rotationally adjustable, it will be understood that cutting drums having multiple rotationally adjustable ring segments are also envisaged.

Figure 7:
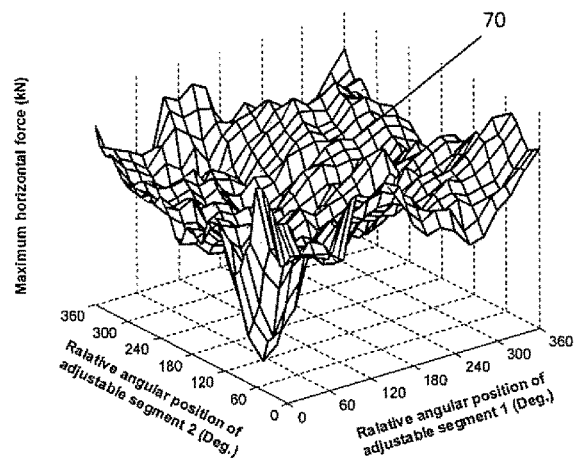
FIG. 7 is a 3D graph illustrating the results of a computer simulation of the relationship between maximum horizontal force acting on a new cutting drum and the angular position of 2 rotatable ring segments of the cutting drum relative to the position(s) of one or more other ring segments of the cutting drum that are not rotated.

For example, a graph 68 illustrating the results of a computer simulation of the relationship between maximum horizontal force acting on a new cutting drum for a particular lacing pattern of cutting tools, and for varying relative angles between 2 rotatable rings and one or more fixed rings, is shown in FIG. 7.

Figure 8:
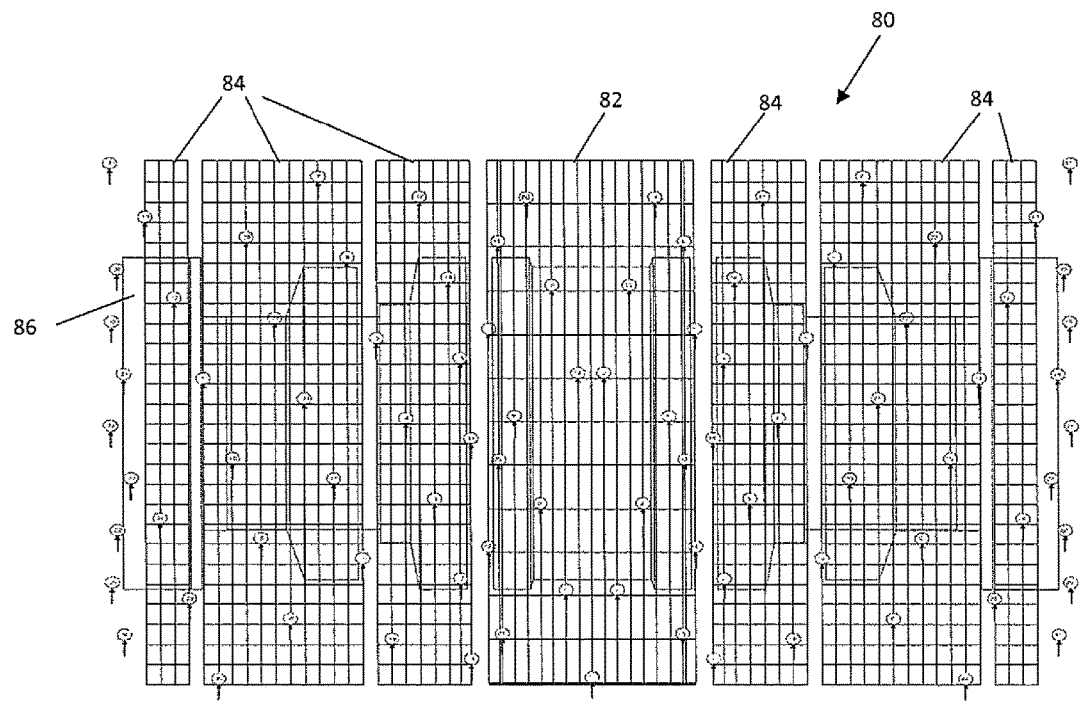
FIG. 8 is a lacing diagram illustrating a cutting tool design pattern indicative of the relative locations of cutting tools on a cutting drum.

An example cutting tool design pattern 80 is shown in FIG. 8. The design pattern 80 includes a design pattern 82, 84 for each respective rotatable and fixed ring segment of a proposed cutting drum. The design pattern 80 shown in FIG. 8 also shows a representation of a shaft 86 on which the rotatable and fixed ring segments may be disposed. The cutting tool design pattern 80 may be used to produce a cutting tool, and in particular may be used to indicate to a manufacturer the relative locations of cutting tools on the outwardly facing surface of a drum member.

Figure 9:
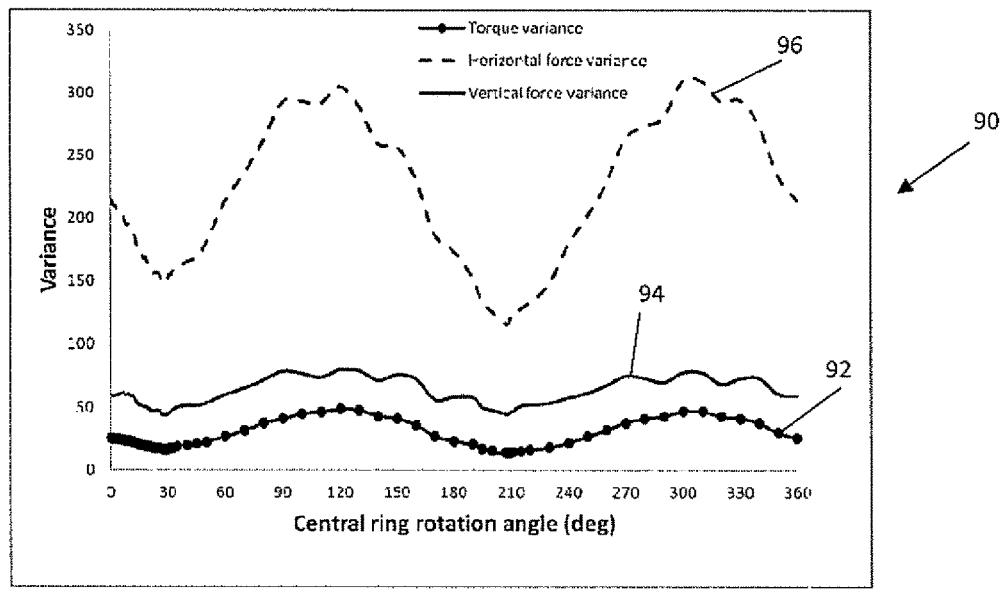
FIG. 9 is a graph illustrating the results of a computer simulation of the relationship between the angular position of a rotatable ring segment of the cutting drum relative to the positions of other ring segments of the cutting drum that are not rotated, and each of torque, horizontal force and vertical force acting on a cutting drum having a lacing design according to the lacing diagram shown in FIG. 8.

A graph 90 illustrating the results of a computer simulation of the relationship between the angular position of a rotatable ring segment and each of torque 92, horizontal force 94 and vertical force 96 for a cutting drum having a lacing design according to the lacing diagram shown in FIG. 8 is shown in FIG. 9.

As can be seen by the relationships illustrated in FIG. 9, an offset angle of about 208 degrees corresponds to minimal torque and vertical/horizontal forces.

Figure 10:
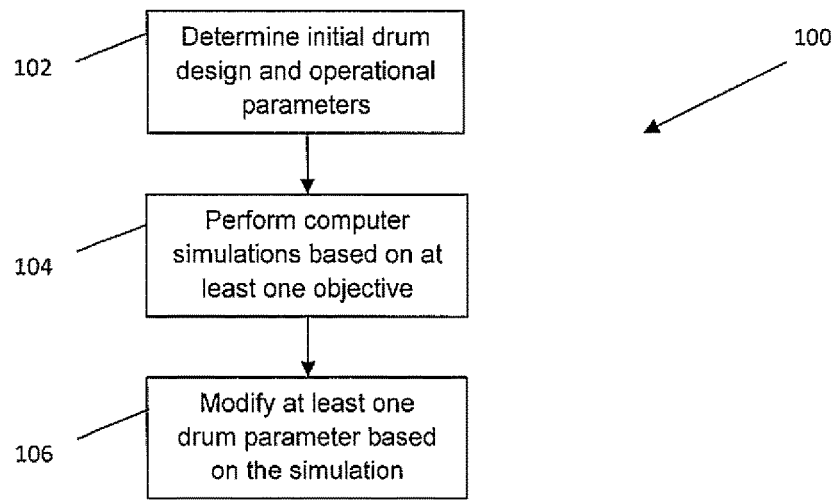
FIG. 10 is a flow diagram illustrating a method of designing a cutting drum in accordance with an embodiment of the present invention.

A flow diagram 100 illustrating steps 102, 104, 106 of a method of designing a cutting drum is shown in FIG. 10.

The method involves first determining 102 drum design and operational parameters indicative of characteristics of the cutting drum, characteristics of the mining machine that is to include the cutting drum, and characteristics of the target rock body with which the cutting drum is to be used. Based on the determined parameters, one or more computer simulations are carried out 104 to determine variations in at least one value relevant to a selected objective for different positions of a rotatable ring segment relative to one or more fixed ring segments. Using the determined variations, a particular location of the rotatable ring segment relative to the at least one fixed ring segment is then selected and, after manufacture of the cutting drum, the rotatable ring segment is moved 106 to the selected relative location and fixed in position.

In the present example, the computer simulations are carried out using cutting drum design software available through CSIRO at Queensland Advanced Technologies, 1 Technology Court, Pullenvale, Queensland, 4069, Australia. However, it will be appreciated that other software, adapted to implement the present functionality, may be used, for example software of the type described in Tiryaki B., Ayhan M. & Hekimoglu O. Z. 2001. A new Computer Program for Cutting Head Drum Design of Roadheaders nd Drum Shearers. $17^{th}$ International Mining Congress and Exhibition of Turkey. 655-662.

It will be appreciated that any suitable operational objective may be used to form the basis of the computer simulations and the subsequent selection of relative position of the rotatable ring segment, such as minimizing energy conservation, maximizing throughput, maximizing dust suppression, and/or reducing tool wear.

Figures 11, 12:
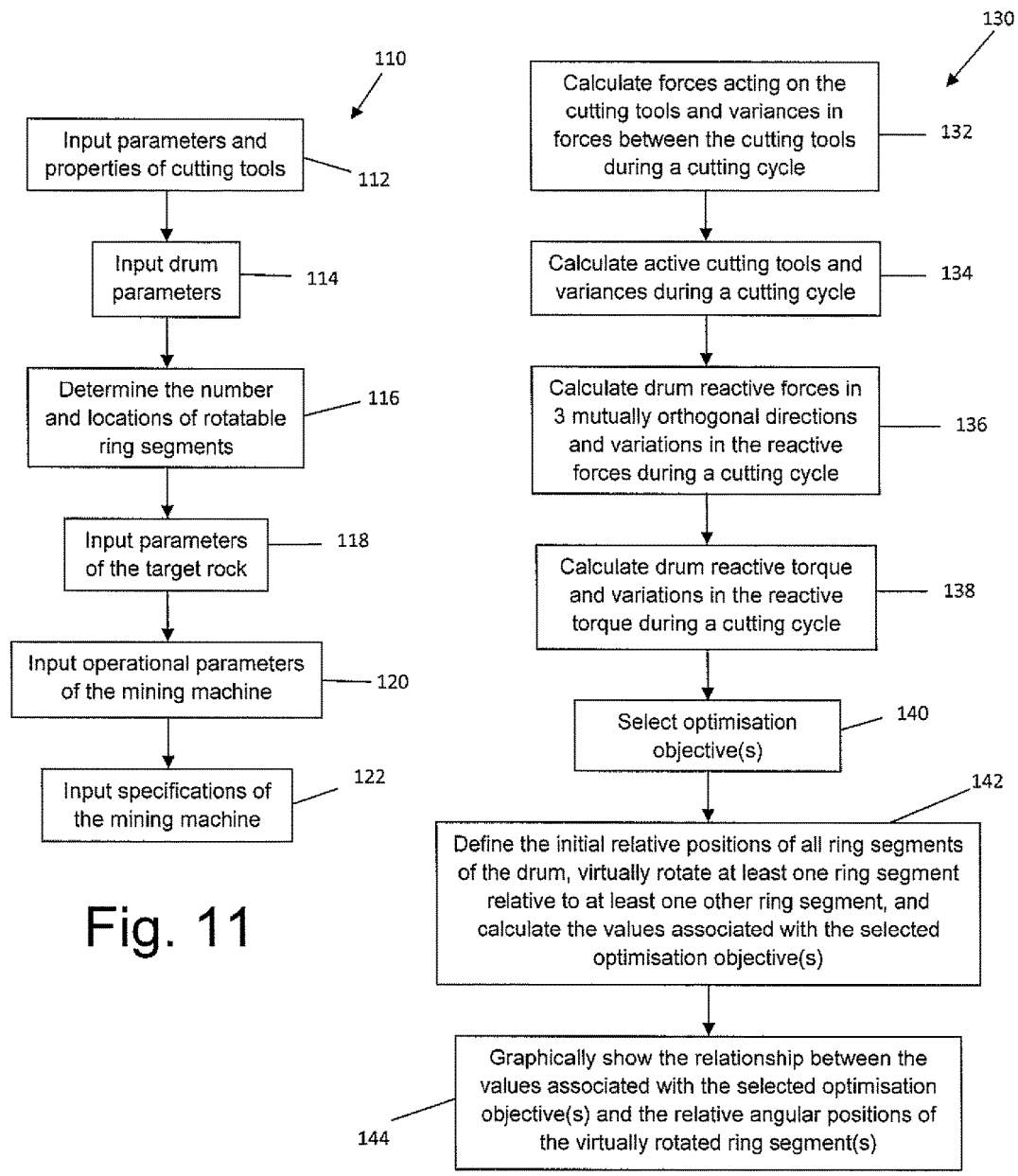
FIG. 11 is a flow diagram illustrating a parameter gathering process of the method shown in FIG. 10.
FIG. 12 is a flow diagram illustrating a cutting drum performance simulation process of the method shown in FIG. 10.

An example process for determining drum design and operational parameters is shown in more detail in flow diagram 110 shown in FIG. 11.

As shown, the process in the present example involves inputting parameters 112 indicative of properties of cutting tools of a cutting drum into cutting drum simulation software, such as the diameter, attack angle and gauge length of the cutting tools, and force formulae associated with the cutting tools; inputting parameters 114 indicative of properties of the cutting drum, such as drum width and diameter, the number of cutting tools, cutting tool line spacing, cutting tool angular position, cutting tool tilt angle and cutting tool profile; and inputting the number of adjustable and fixed ring segments, and the relative of the adjustable ring segments.

The process for determining drum design and operational parameters also involves inputting parameters 118 associated with the target rock body, such as UCS, BTS, CERCHAR abrasivity index and breakout angle; inputting operational parameters 120 associated with the mining machine with which the cutting drum is to be used, such as linear advance speed, cut sector, cutting mode, cutting width, drum rotation speed parameters; and inputting data 122 indicative of motor power and mechanical efficiency.

An example process for performing computer simulations is shown in more detail in flow diagram 130 shown in FIG. 12.

As shown, the process in the present example involves using simulation software to calculate 132 forces acting on cutting tools and variances in the forces during a cutting cycle, calculate 134 active cutting tools and variances during a cutting cycle, calculate 136 drum reactive forces in 3 mutually orthogonal directions and variances in the reactive forces during a cutting cycle, and calculate 138 drum reactive torque and variations during a cutting cycle.

The simulation process also involves selecting 140 one or more operational objectives, setting initial relative virtual positions 142 of all ring segments of the cutting drum, virtually rotating an adjustable ring segment relative to the fixed ring segments, and at each adjustable ring position calculate one or more values associated with the selected operational objective.

The calculated values can be presented to a user in graphical form, for example of the form shown in FIG. 5 for a cutting drum having 1 rotatable ring segment, or of the form shown in FIG. 7 for a cutting drum having 2 rotatable ring segments. As an alternative, a table may be used to represent the calculated values for different relative positions of one or more rotatable ring segments.

Figure 13:
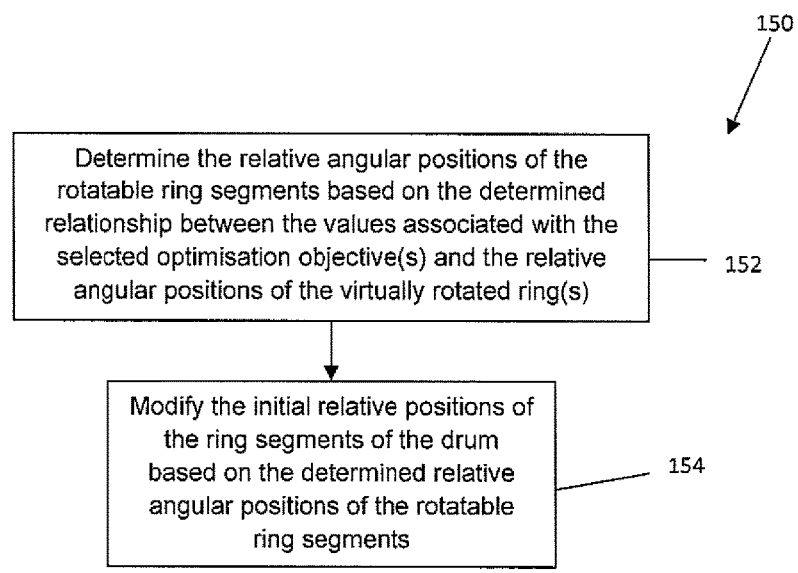
FIG. 13 is a flow diagram illustrating a cutting drum modification process of the method shown in FIG. 10, the cutting drum modification process carried out in response to the performance simulation process shown in FIG. 12.

The selected operational objective may correspond to an optimisation objective, for example maximising throughput. An example process for applying the determined cutting drum modification is shown in more detail in flow diagram 150 shown in FIG. 13.

As shown, the process involves using the calculated values 152, and in particular using the graphical representations of the values, to determine the relative rotational positions of the or each rotatable ring segment relative to the fixed ring segment(s) that correspond the selected objective. After determining the relative rotational positions of the rotatable ring segment(s), after manufacture of the cutting drum, each relevant ring segment is moved 154 to the location corresponding to the position determined by the simulation.

It will be understood that as a consequence of implementing the cutting drum design method 100, a cutting drum is produced that has defined characteristics tailored to one or more particular operational objectives.

Moreover, the design process enables an initial lacing design, which is typically created through a mixture of experience and computer modelling, to be further optimised through conveniently rotating at least one ring segment of the cutting drum relative to the other segment(s).

A control system may be provided that is programmed into two or more operational modes corresponding to different cutting tool design lacing patterns. The operating modes may correspond to different performance/design objectives, e.g. energy efficient mode; increase throughput mode; and cutting tool wear minimisation mode. The control system may be used to semi-automatically or automatically adjust cutting tool lacing of the cutting drum.

It will be appreciated that a cutting drum designed according to the present cutting drum design method has operational parameters that are significantly improved over a conventionally designed cutting drum. Table 1 below illustrates differences in operational parameters between a cutting drum designed according to the present method and a cutting drum designed using a conventional method.

TABLE 1

Improvement in cutting tool design over conventional computer aided design

| | | Drum designed with conventional method | Drum improved with the invented method | Difference (%) |
|---|---|---|---|---|
| Variance | Horizontal force | 214.2 | 115.3 | 46.18 |
| | Vertical force | 59.7 | 44.7 | 25.19 |
| | Torque | 25.8 | 13.4 | 47.81 |
| Maximum force (kN) | Horizontal | 203.28 | 191 | 6.03 |
| | Vertical | 23.7 | 22.9 | 3.23 |
| Maximum torque (kN-m) | | 62.6 | 59.7 | 5.02 |

As the cutting drum is used, the operational characteristics of the cutting drum will change, primarily because the physical characteristics of the cutting drum change, for example because the cutting tools become progressively worn through prolonged use.

Figure 14:
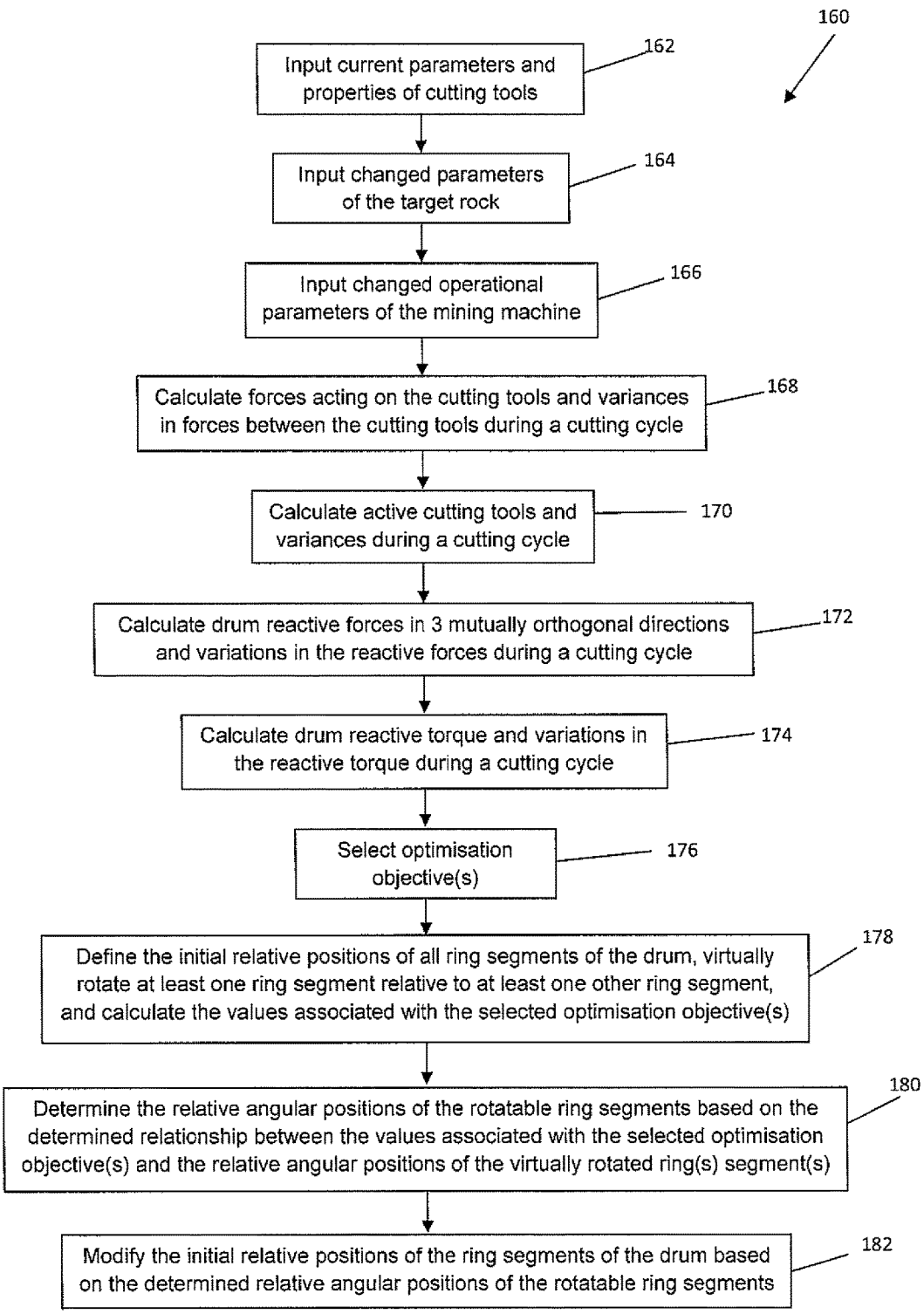
FIG. 14 is a flow diagram illustrating a method of redesigning a cutting drum in accordance with an embodiment of the present invention.

In order to maintain efficiency of the cutting drum, and in particular to maintain performance in respect of the operational objective(s), a method of redesigning the cutting drum is carried out. An example cutting drum redesigning method 160 is shown in FIG. 14.

The redesigning method 160 is similar to the designing method represented in FIGS. 10 to 13 in that computer software is used to analyse performance characteristics of a cutting drum, and in response to the analysis, one or more adjustable ring segments are rotated to a position corresponding to a desired cutting drum performance. However, the redesigning method occurs after instead of before the cutting drum has been used.

The redesigning method 160 is implemented after a cutting drum has been used for a prolonged period and the operational characteristics of the cutting drum have changed, for example because the cutting tools have worn. The objective is to restructure the lacing pattern of the cutting drum after the drum has been used for a prolonged period of time in order to achieve a particular operational objective, for example to optimise at least one operational parameter.

The redesigning method 160 involves inputting parameters 162 indicative of current properties of the cutting tools of the cutting drum into cutting drum simulation software, such as the diameter, attack angle and gauge length of the cutting tools, which may have changed through use of the cutting tool, inputting any changed parameters 164 associated with the target rock body, such as UCS, BTS, CERCHAR abrasivity index and breakout angle, and inputting changed operational parameters 166 associated with the machine with which the cutting drum is being used, such as linear advance speed, cut sector, cutting mode, cutting width and drum rotation speed.

The redesigning method 160 then involves using the simulation software to calculate 168 forces acting on the current cutting tools and variances in the forces during a cutting cycle, calculate 170 active cutting tools and variances during a cutting cycle, calculate 172 drum reactive forces in 3 mutually orthogonal directions, and calculate drum reactive torque 174 and variances in the reactive forces and torque during a cutting cycle.

The redesigning method 160 then involves setting initial relative virtual positions of all ring segments of the current cutting drum, virtually rotating the adjustable ring segment relative to the fixed ring segments, and at each adjustable ring position calculate one or more values associated with the operational objective. As with the cutting drum designing process, the calculated values can be presented to a user in graphical form, for example of the form shown in FIG. 6.

Using the graphically presented values, the rotational positions of the or each rotatable ring segment relative to the fixed ring segment(s) that correspond the selected objective are determined 180, and each relevant ring segment is then moved 182 to the rotational position determined by the simulation.

It will be appreciated that the cutting drums and method of designing a cutting drum described above are suitable for any type of earth moving equipment including continuous miners and surface miners. Such earth moving equipment find application in a broad array of industries including mining and road construction industries wherein cutting drums are used to excavate or redistribute earth.

In the claims which follow and in the preceding description of the invention, except where the context requires otherwise due to express language or necessary implication, the word "comprise" or variations such as "comprises" or "comprising" is used in an inclusive sense, i.e. to specify the presence of the stated features but not to preclude the presence or addition of further features in various embodiments of the invention.

Modifications and variations as would be apparent to a skilled addressee are deemed to be within the scope of the present invention.

The invention claimed is:

1. A method of designing a cutting drum for earth moving equipment, the cutting drum comprising two or more ring segments, each ring segment comprising a plurality of cutting tools, and the rotational position of at least one ring segment being rotatable relative to one or more other ring segment about a rotation axis of the cutting drum and fixable in a new rotational position, the method comprising the steps of:
   (A) inputting a plurality of design parameters of a cutting drum into a computer program;
   (B) performing a computer simulated analysis of the cutting drum using the computer program to determine at least one operational value associated with at least one design objective;
   (C) using the computer simulated analysis to determine the relative rotations of the ring segments that correspond to the at least one design objective; and
   (D) rotating the or each rotatable ring segment relative to at least one other ring segment so that the relative rotations of the ring segments correspond to the at least one design objective.

2. The method according to claim 1, further comprising repeating steps (A) to (D) after the cutting drum has been used.

3. The method according to claim 1, wherein step (B) comprises virtually progressively rotating the or each rotatable ring segment relative to at least one other ring segment and calculating values associated with the design objective (s) after each virtual rotation.

4. The method according to claim 3, wherein step (C) comprises using the calculated values to determine the relative locations of the ring segments that correspond to the at least one design objective.

5. The method according to claim 1, wherein the design objective is selected from the group consisting of:
   vi. reducing energy usage;
   vii. reducing manufacturing cost;
   viii. increasing throughput;
   ix. reducing dust formation; and
   x. reducing cutting tool wear.

6. The method according to claim 1, further comprising the steps of:
   graphically displaying of at least a portion of the computer simulated analysis; and
   using the graphical display to determine at least one operational value associated with the at least one design objective.

7. A computing device comprising non-transitory computer readable medium with program code stored thereon that, when executed by the computing device, causes the computing device to carry out the method according to claim 1.

8. A cutting drum for earth moving equipment, comprising:
   a drum portion comprising a plurality of ring segments;
   a plurality of cutting tools disposed on an outwardly facing surface of the drum portion, the cutting tools forming a cutting tool lacing design, each ring segment comprising at least one cutting tool;
   wherein at least one ring segment is rotatable relative to at least one other ring segment about a rotation axis of the cutting drum such that the cutting tool lacing design is adjustable.

9. The cutting drum according to claim 8, wherein ring segments comprise at least one fixed ring segment and at least one rotatable ring segment.

10. The cutting drum according to claim 8, comprising a plurality of rotatable ring segments.

11. The cutting drum according claim 8, wherein at least one rotatable ring segment is rotatable 360 degrees around a common axis relative to at least one other ring segment.

12. The cutting drum according to claim 8, wherein at least one of the ring segments is detachable.

13. The cutting drum according to claim 8, wherein each rotatable ring segment is disposable in a locked position wherein the rotatable ring segment engages with an adjacent fixed ring segment and the rotatable ring segment is not rotatable relative to the adjacent fixed ring segment, and a released position wherein the rotatable ring segment is rotatable relative to the adjacent fixed ring segment.

14. The cutting drum according to claim 13, comprising a shaft on which each ring segment is disposed, one of the shaft and a fixed ring segment including a key member, and the other of the shaft and the fixed ring segment including a channel arranged to slidably receive the key member, the key member and the channel cooperating to prevent rotation of the fixed ring segment whilst permitting slidable movement of the fixed ring member relative to the shaft.

15. The cutting drum according to claim 13, wherein each rotatable ring segment and adjacent fixed ring segment include complimentary first and second engagement portions arranged to enable the rotatable ring segment to mate with the adjacent fixed ring segment and thereby prevent rotation of the rotatable ring segment relative to the adjacent fixed ring segment.

16. The cutting drum according to claim 8, wherein the cutting tools comprise cutting picks, saws and/or drill bits.

17. A mining machine comprising a cutting drum as claimed in claim 8.

18. A method of cutting comprising using the cutting drum according to claim 8.

* * * * *

UNITED STATES PATENT AND TRADEMARK OFFICE
CERTIFICATE OF CORRECTION

PATENT NO. : 10,366,177 B2
APPLICATION NO. : 14/381731
DATED : July 30, 2019
INVENTOR(S) : Xing Sheng Li et al.

Page 1 of 1

It is certified that error appears in the above-identified patent and that said Letters Patent is hereby corrected as shown below:

In the Claims

Column 11, In Claim 1 Line 4 please delete "the rotational position of"

Signed and Sealed this
Seventh Day of April, 2020

Andrei Iancu
*Director of the United States Patent and Trademark Office*